(12) United States Patent
Grandin et al.

(10) Patent No.: US 10,935,648 B2
(45) Date of Patent: Mar. 2, 2021

(54) METHOD OF PROCESSING A SIGNAL FORMED OF A SEQUENCE OF PULSES

(71) Applicant: THALES, Courbevoie (FR)

(72) Inventors: Jean-François Grandin, Elancourt (FR); Jean-Marie Lemoine, Elancourt (FR); Eric Coignet, Elancourt (FR)

(73) Assignee: THALES, Courbevoie (FR)

( * ) Notice: Subject to any disclaimer, the term of this patent is extended or adjusted under 35 U.S.C. 154(b) by 204 days.

(21) Appl. No.: 16/300,951

(22) PCT Filed: May 19, 2017

(86) PCT No.: PCT/EP2017/062185
§ 371 (c)(1),
(2) Date: Nov. 12, 2018

(87) PCT Pub. No.: WO2017/198860
PCT Pub. Date: Nov. 23, 2017

(65) Prior Publication Data
US 2019/0137615 A1    May 9, 2019

(30) Foreign Application Priority Data

May 20, 2016 (FR) .................................... 16 00815

(51) Int. Cl.
*G01S 13/22* (2006.01)
*H03K 9/06* (2006.01)
(Continued)

(52) U.S. Cl.
CPC ............ *G01S 13/227* (2013.01); *G01S 7/021* (2013.01); *G01S 7/2813* (2013.01); *H03K 9/06* (2013.01)

(58) Field of Classification Search
CPC ...... G01S 13/227; G01S 7/021; G01S 7/2813; G01S 7/2927; H03K 9/06; H04B 1/719
See application file for complete search history.

(56) References Cited

U.S. PATENT DOCUMENTS 5,396,250 A    3/1995 Tsui et al.
5,583,505 A * 12/1996 Andersen ................ G01S 7/021
                                                          342/13
(Continued)

FOREIGN PATENT DOCUMENTS

EP    2309289 A1    4/2011

OTHER PUBLICATIONS

Mardia, H. K., "New Techniques for the Deinterleaving of Repetitive Sequences," IEE Proceedings F. Communications, Radar & Signal Processing, Institution of Electrical Engineers, Stevenage, GB, vol. 136, No. 4, Part F, Aug. 1, 1989, pp. 149-154.
(Continued)

*Primary Examiner* — Bernarr E Gregory
(74) *Attorney, Agent, or Firm* — Soquel Group LLC (57) ABSTRACT

A method for processing a signal formed of a sequence of pulses, including at least one repetitive pattern formed of at least one pulse, the pattern being repeated in the signal with a pattern repetition period, the method including estimating the pattern repetition period of the signal and calculating, as a function of (i) an arrival date of each pulse with respect to a chosen reference arrival date, and (ii) the estimated pattern repetition period, a sequence of phases; thereafter, the method includes estimating, on the basis of the calculated sequence of phases, at least one phase value and an associated standard deviation, the phase value being associated with a phase moment representative of the repetitive pattern, and obtaining and utilizing parameters characterizing the digital signal by using the estimated phase values.

11 Claims, 4 Drawing Sheets

(51) Int. Cl.
*G01S 7/02* (2006.01)
*G01S 7/28* (2006.01)
*G01S 13/00* (2006.01)

(56) References Cited

U.S. PATENT DOCUMENTS

| | | | | |
|---|---|---|---|---|
| 6,191,727 | B1* | 2/2001 | Springer | G01S 7/021 |
| | | | | 342/13 |
| 6,717,545 | B2* | 4/2004 | Dizaji et al. | G01S 7/2927 |
| | | | | 342/93 |
| 7,133,887 | B2* | 11/2006 | Sirois | G01S 7/021 |
| | | | | 708/422 |
| 7,397,415 | B1* | 7/2008 | Wang | G01S 7/021 |
| | | | | 342/13 |
| 7,830,297 | B1* | 11/2010 | Wang | G01S 7/021 |
| | | | | 342/13 |
| 8,587,468 | B2* | 11/2013 | Card | G01S 7/021 |
| | | | | 342/13 |
| 9,063,210 | B2* | 6/2015 | Hammack | G01S 7/021 |
| 9,229,095 | B2* | 1/2016 | Hammack | G01S 7/021 |
| 2009/0268851 | A1* | 10/2009 | Schwoerer | H04B 1/719 |
| | | | | 375/340 |

OTHER PUBLICATIONS

International Search Report for Patent Application No. PCT/EP2017/062185 dated Aug. 16, 2017, 3 pages.

\* cited by examiner

METHOD OF PROCESSING A SIGNAL FORMED OF A SEQUENCE OF PULSES

CROSS-REFERENCE TO RELATED APPLICATIONS

This application claims benefit under 35 USC § 371 of PCT Application No. PCT/EP2017/062185 entitled METHOD OF PROCESSING A SIGNAL FORMED OF A SEQUENCE OF PULSES, filed on May 19, 2017 by inventors Jean-Francois Grandin, Jean-Marie Lemoine and Eric Coignet. PCT Application No. PCT/EP2017/062185 claims priority of French Patent Application No. 16 00815, filed on May 20, 2016.

FIELD OF THE INVENTION

The present invention relates to a method for processing a signal formed of a sequence of pulses, comprising at least one repeating pattern formed of at least one pulse, said pattern being repeated in the signal with a pattern repetition period.

The invention belongs to the field of processing signals, in particular digital signals, and is particularly applicable in the field of characterizing radar pulse sequences.

BACKGROUND OF THE INVENTION

Indeed, a periodic or cyclo-periodic signal, made up of repeating pulse patterns, is generally characterized by parameters, comprising the pattern repetition period, or PRP, and pulse repetition intervals, or PRI, of the signal. In practice, characterizing a radar signal intercepted in a listening timeslot in particular makes it possible to identify the emission mode of the intercepted signal or to trackback pulse sequences coming from a same emission.

In a known manner, the pulse repetition intervals are used to characterize such a sequence of pulses.

However, the PRI values are distorted in case of random loss of pulses of the signal, phenomenon also known as scattering, which occurs in practice.

The invention aims to characterize time repetition periods of the pulses in a pulse sequence, in particular in the case of random losses.

SUMMARY OF THE DESCRIPTION

To that end, according to a first aspect, the invention proposes a method for processing a signal formed of a sequence of pulses, comprising at least one repeating pattern formed of at least one pulse, said pattern being repeated in the signal with a pattern repetition period. The method comprises the following steps:
  estimating the pattern repetition period of said signal,
  calculating a sequence of phases as a function of an arrival date of each pulse relative to a chosen reference arrival date and of the estimated pattern repetition period,
  from said calculated sequence of phases, estimating at least one phase value and an associated standard deviation, said phase value being associated with a phase moment representative of the repetitive pattern;
  obtaining and exploiting characterization parameters of the signal by using the estimated phase values.

Advantageously, the method according to the invention makes it possible to characterize the characteristic time repetitions of a sequence of pulses robustly with respect to random pulse losses.

The proposed method is applicable for sequences of pulses with interleaved or successive pulse trains, the repetition period of the pulses of a pulse train being able to be affected or not by a random or pseudorandom noise inducing a fluctuation of the repetition period relative to an average value.

The method according to the invention may have one or more of the features below, considered independently or in all technically acceptable combinations.

It comprises, after the step for calculating a sequence of phases, a step for building a histogram of phases, and extracting one or several peak(s) from the histogram, each peak being associated with a phase moment of the sequence of pulses.

The step for estimating a phase associated with a moment of the sequence of pulses, said moment being associated with a peak of the phase histogram, comprises extracting a subset of arrival dates around said peak, and obtaining a precise estimate of the phase value associated with said moment and a variance associated with the estimated phase value.

When the sequence of pulses comprises a plurality of interleaved pulse trains, each pulse train having an associated phase moment, the precise estimate of the phase associated with the moment comprises a vectorial summation of unit vectors, each vector having an orientation equal to a calculated phase value, with the pattern repetition period of said signal estimated beforehand, from an arrival date of said subset, said vectorial summation providing a resulting vector.

The phase value associated with said estimated moment is equal to the argument of said resulting vector.

When the sequence of pulses comprises a plurality of successive pulse trains, each pulse train having an associated phase moment, the precise estimate of the phase associated with a treated moment further comprises an estimate of a pattern repetition period corresponding to said moment from a subset of considered arrival dates.

The estimate of the pattern repetition period of the signal comprises a first rough estimate of a first estimated value of the pattern repetition period, and a second refined estimate of the second estimated value of the pattern repetition period.

During the step for obtaining a sequence of phases, for each pulse arrival date $t_n$, a period folding equal to the estimated pattern repetition period is applied according to the following formula:

$$\phi(t_n)_{\lambda,t_0} = \lambda \cdot \left( \frac{t_n - t_0}{\lambda} - \left\lfloor \frac{t_n - t_0}{\lambda} \right\rfloor \right)$$

Where $\lfloor x \rfloor$ is the result of rounding down the real number x to the nearest integer, $t_0$ is the reference arrival date and $\lambda$ is the estimated pattern repetition period.

According to another aspect, the invention relates to a device for processing a signal made up of a sequence of successive pulses, able to implement a method as briefly described above.

This device comprises at least one computing processor able to implement:
  a unit for estimating the pattern repetition period of said signal,
  a unit for computing a sequence of phases, as a function of an arrival date of each pulse relative to a chosen reference arrival date and of the estimated pattern repetition period, a unit for estimating, from said calculated sequence of phases, at least one phase value and an associated standard deviation, said phase value being associated with a phase moment representative of the repetitive pattern;

a unit for obtaining and exploiting characterization parameters of the digital signal by using the estimated phase values.

According to one embodiment, the device further comprises a unit for building a histogram of phases, and extracting one or several peak(s) from the histogram, each peak being associated with a phase moment of the sequence of pulses.

According to another embodiment, the invention relates to a computer program including software instructions which, when executed by a programmable device, carrying out a method for processing a signal formed by a sequence of pulses as briefly described above.

According to another aspect, the invention relates to an information recording medium, including software instructions for carrying out an automated method for processing a signal formed by a sequence of pulses as briefly described above, when these instructions are executed by a programmable device.

BRIEF DESCRIPTION OF THE DRAWINGS

Other features and advantages of the invention will emerge from the description thereof provided below, for information and non-limitingly, in reference to the appended figures, in which.

DETAILED DESCRIPTION

Figure 1:
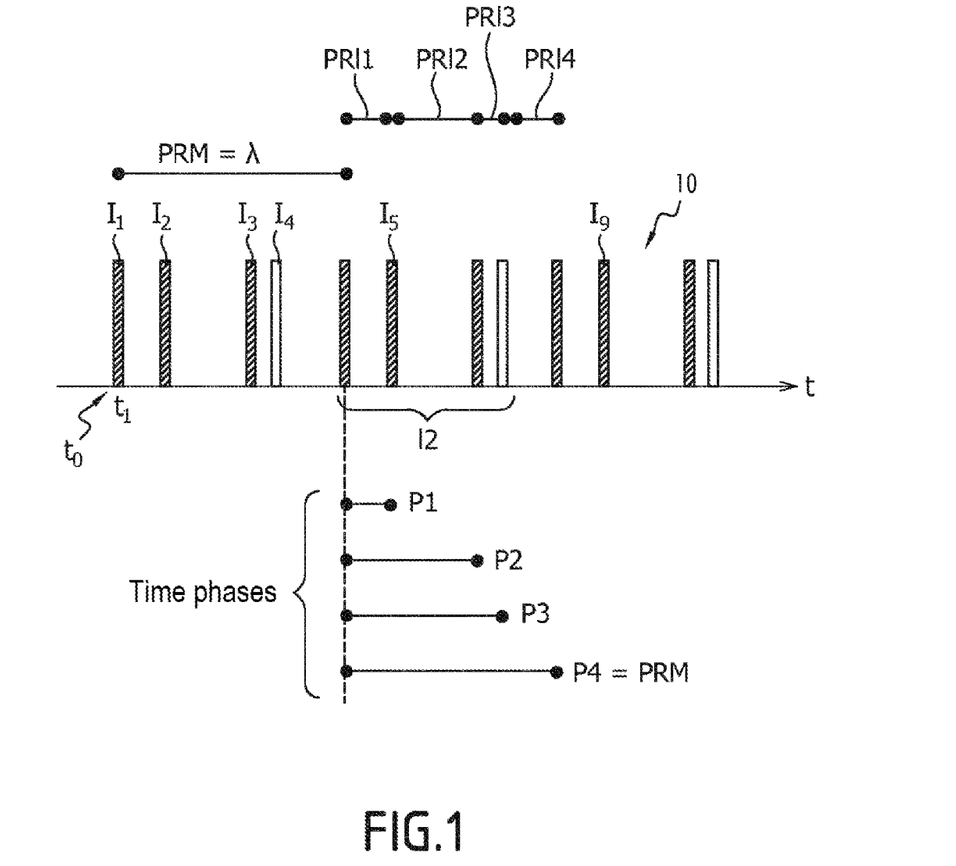
FIG. 1 is a schematic view of a sequence of pulses with interleaved pulse trains.

FIG. 1 schematically shows a digital signal S including a sequence of pulses 10, made up of pulses $I_1, I_2, \ldots I_n$ received successively over time. Each pulse $I_k$ is illustrated schematically on a time axis.

The sequence of pulses 10 is a pattern repetition sequence, and in the illustrated simplified example, comprises four interleaved periodic binary trains.

Of course, in practice, processed real digital signals comprise any number P of interleaved signals.

In the example of FIG. 1, the pattern 12 is made up of four successive signals $I_1$ to $I_4$, and pattern repetition period $\lambda$.

The differences between arrival dates on the time axis, known using the abbreviation DTOA ("difference of time of arrival") between two successive pulses make it possible to calculate the interval values between two successive pulses, respectively denoted $PRI_1$ to $PRI_4$.

Each of the pulse trains interleaved in the pulse sequence 10 is made up of pulses repeating with a repetition period $\lambda$, equal to the pattern repetition period of the pulse sequence 10.

In other words, each pulse train $T_p$ is made up of pulses $\{I_{k \cdot \lambda + p}\}$.

The reference arrival date to is chosen arbitrarily, for example equal to the date of arrival of the first pulse in the considered pulse sequence.

The random loss of a subpart of the pulses causes an error in calculating the values of $PRI_k$ of a received sequence of pulses.

It is proposed to calculate phase values for each pulse, representative of the difference $P_i$, for each pulse, between its date of arrival and a periodized reference date relative to the pattern repetition period. In particular, $P_1$ to $P_4$ are illustrated in FIG. 1 for the considered example.

The phase values are calculated as follows.

From a sequence of dates of arrival $\{t_k\}$, phases are calculated, with a given period folding $\lambda$, relative to a reference date of arrival to, using the following formula:

$$\theta_k = \phi(t_k)_{\lambda, t_0} = \lambda \cdot \left( \frac{t_k - t_0}{\lambda} - \left\lfloor \frac{t_k - t_0}{\lambda} \right\rfloor \right) \quad \text{(EQ 1)}$$

Where $\lfloor x \rfloor$ is the rounding down the real number x to the nearest integer.

The phase values $\theta_k$ are greater than or equal to 0 and strictly less than $\lambda$.

The phase values thus calculated are more robust to random pulse losses than the DTOA values measured between successive pulses, when the respective reference date of arrival $t_0$ and period $\lambda$ values are known or previously determined.

Figure 2:
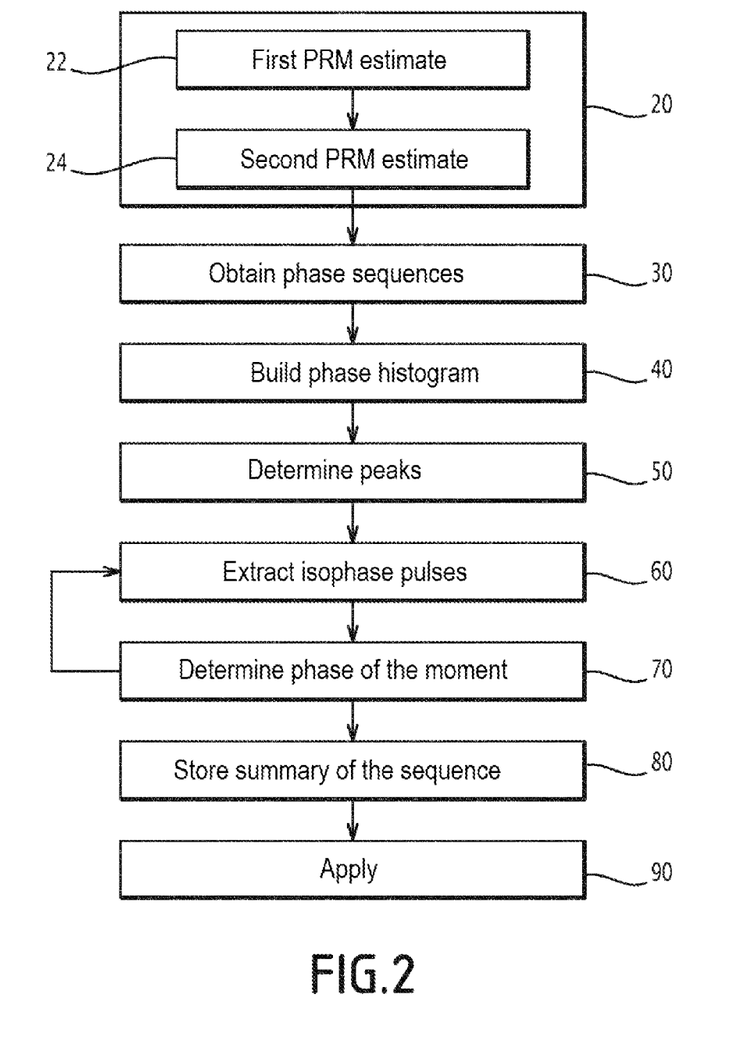
FIG. 2 is a block diagram of the main steps of a method according to one embodiment of the invention.

The main steps of one embodiment of the signal processing method according to the invention are described below in reference to FIG. 2.

This method applies in the case of a pulse sequence made up of a plurality of P interleaved pulse trains, with P an integer greater than 1, each pulse train forming a phase moment m(i) of the pulse sequence. Such a pulse sequence is also called "stagger with P moments". For example, FIG. 1 illustrates a stagger signal with 4 moments.

The method according to the invention also applies to the case of a sequence of pulses formed by a plurality of P pulse trains that follow one another temporally, each of the pulse trains having an associated pattern repetition period, equal to the repetition period of the pulses of said pulse train.

It is not necessary to know the type of sequence in advance, the method allowing it to be deduced.

In one scenario, the pulse sequence is also affected, deliberately upon creation by the radar designer, by a noise called jitter, the repetition period of the pulses fluctuating randomly or pseudo-randomly around an average value.

Each moment m(i) has an associated phase value, the pulses of the pulse train $T_i$ associated with m(i) having a repetition period $\lambda$, which is the same as the repetition period associated with the pulse sequence.

In the described embodiment, one has dates of arrival: $\{t_k, 1 \le k \le n\}$ of the pulses of a pulse sequence to be processed, in a given temporal coordinate system. These dates of arrival are for example stored in a memory of a computing device configured to implement the invention.

During a first step 20 for estimating the pattern repetition period, implemented in the described embodiment, a pattern repetition period value, simply called PRM, of the pulse sequence, denoted $\hat{\lambda}$, is calculated.

This calculation comprises two sub-steps, a first sub-step 22 of first estimatation, also called rough estimate, making it possible to obtain a first estimated value $\lambda_g$ of the PRM, followed by a second sub-step 24 of second estimation, also called fine estimate, making it possible to obtain a second estimated value, $\hat{\lambda}$, of the PRM.

The first sub-step 22 implements any known method for estimating the pattern repetition period. For example, pattern estimating methods are described in the document "New techniques for the deinterleaving of repetitive sequences", by H. K. Mardia et al, published in IEE Proceedings F, vol 136 No. 4, pp. 149-154, in August 1989. This estimation 22 is for example carried out using histogram methods of the differences in date of arrival (DTOA). Alternatively, any other method for estimating the pattern repetition period, using a Fourier transform or a wavelet transform, can be used. However, since in this first sub-step 22, the precision of the estimate is not sought, it is preferable to use a simple and inexpensive calculation method rather than a method based on transforms, which have a high computation cost.

During the sub-step 24 for the second estimate of the PRM, for each stored date of arrival, an associated integer index is calculated as a function of the first estimated value $\lambda_g$ of the PRM:

$$k(i) = \left\lfloor \frac{t_i}{\lambda_g} \right\rfloor, i = 1, \ldots, n \quad (EQ\ 2)$$

Next, the following calculation is done:

$$\hat{\lambda} = \sum_{i=1}^{n} \left( \frac{6 \cdot (2 \cdot k(i) - k(n) - 1)}{k(n) \cdot (k(n)^2 - 1)} t_i \right) \quad (EQ\ 3)$$

The variance associated with this estimate is given by:

$$\mathrm{Var}(\hat{\lambda}) \approx \frac{12 \cdot \sigma^2}{n^3 - n} \quad (EQ\ 4)$$

n being the number of pulses of the pulse sequence, and c being the standard deviation of the time measurement t.

The standard deviation c is that of the instrument for measuring dates of arrival. It is known for each instrument, for the conditions of measurements done in interception.

The calculations indicated above in particular apply for modeling of the dates of arrival according to a linear model as a function of the values of k(i), in other words for a periodic series of pulses with period $\lambda$:

$$t_i = t_0 + \lambda \cdot k(i) + \epsilon \quad (EQ\ 5)$$

The above calculations apply for sequences of pulses with P interleaved trains, optionally noised by a noncumulative noise.

In the case of noising by noncumulative noise, each date of arrival may be written as follows:

$$t_i = (i-1)\lambda + \phi_{m(i)} + v_i \quad (EQ\ 6)$$

Where $v_i$ is a centered noise with standard deviation $\sigma_v$ and $\phi_{m(i)}$ the phase value of the moment m(i).

According to one alternative, the perceived sequence of pulses is affected by a cumulative noise (jitter):

$$t_i = \lambda + t_{i-1} + \phi + v_i \quad (EQ\ 7)$$

Where $v_i$ is a centered Gaussian white noise with standard deviation $\sigma_v$ and $\phi$ the phase of the considered train of pulses of the sequence.

In this alternative, the following calculation is applied for the second estimate of the PRM:

$$\hat{\lambda} = \frac{t_n - t_1}{n - 1} \quad (EQ\ 8)$$

The variance associated with this estimate is given by:

$$\mathrm{Var}(\hat{\lambda}) \approx \frac{\sigma^2}{n - 1} \quad (EQ\ 9)$$

n being the number of pulses of the sequence and c being the standard deviation of the measure at time t. The standard deviation quadratically accumulates the measurement standard deviation of the time t and the standard deviation $\sigma_v$ of the jitter law.

Returning to FIG. 2, step 20 for estimating the PRM is followed by a step 30 of calculating a sequence of phases, by calculation according to formula (EQ1), taking into account the chosen reference date of arrival $t_0$ and the value of the estimated PRM $\hat{\lambda}$ obtained in step 20.

One therefore obtains a sequence of phases: $\{\theta_k, 1 \leq k \leq n\}$, $\theta_k \in [0, \hat{\lambda}[$ The step of obtaining a sequence of phases 30 is followed by a step 40 of building a histogram of phases.

Figure 3:
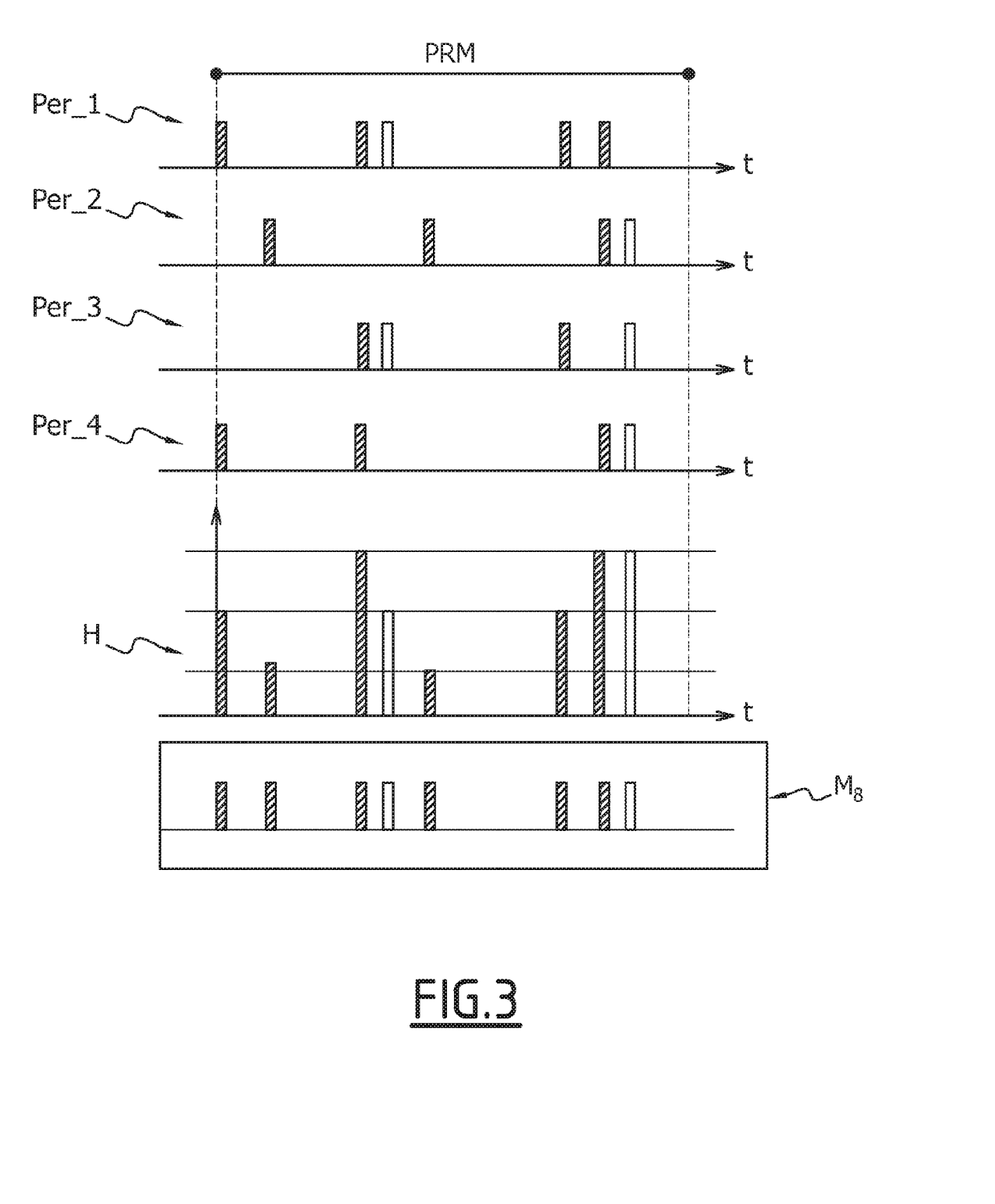
FIG. 3 schematically shows several repetition periods of a digital signal and an associated phase histogram.

FIG. 3 schematically illustrates a sequence of pulses with wholes, comprising 4 successive periods, denoted Per_1 to Per_4, superimposed in the depiction illustrated so as to show the folding, and the associated phase histogram H.

It appears from this schematic illustration that the pattern $M_8$ of the pulse sequence, which is a so-called stagger pattern 8 in this example, can be reconstituted from the phase histogram.

Of course, this is a schematic example. In practice, the processed pulse sequences comprise pulses that are closer together in time and/or a larger number of interleaved pulse trains.

Returning to FIG. 2, the step 40 for building a phase histogram is followed by a step 50 for searching for peaks in the phase histogram.

Any known method to that effect is applied.

In one embodiment, the peaks selected in the histogram are the rays of the histogram whose height strictly exceeds a chosen threshold. When only a very small number of rays in the histogram are in proportion to the size of the histogram, for example fewer than ten percent, the chosen threshold is equal to zero and the selected peaks are all the rays of the histogram (this case often corresponds to the presence of a single radar signal). Conversely, when there are a large number of rays (this case often corresponds to the presence of several radar signals), the chosen threshold is the average of the heights of the rays of the histogram, or alpha times this average, with alpha being greater than or equal to 1.

In one processing alternative, the peaks selected in the histogram are adjacent groups of rays of the histogram whose height exceeds the calculated threshold like before and surrounding a local height maximum in the histogram.

Each histogram peak corresponds to a phase value of one moment of the pulse sequence.

Step 50 is followed by steps 60 and 70 for estimating the phase value for each phase moment, which are iterated for each peak found in step 50.

For a processed current moment m(p), the isophase pulses are extracted (step 60), i.e., pulses whose calculated phase is close to the phase associated with the current moment m(p). Indeed, in practice, due to the quantification of the measured time, the calculated phase values may be slightly different for the pulses of a same phase moment over successive pulse repetition intervals.

Furthermore, the phase values may be affected by a jitter, with noncumulative or cumulative noise.

In one embodiment, in step 60, the pulses are selected that are located around the processed histogram peak, in a window of size determined by the standard deviation of the jitter, for example a window size close to three times the standard deviation of the jitter.

Step 60 for extracting the isophase pulses is followed by a step 70 for a precise estimate of the phase value associated with the moment m(p).

During step 70, for a first sequence of pulses made up of a plurality P of interleaved pulse trains, the pattern repetition period $\hat{\lambda}$ is used, estimated in step 20, for each processed moment m(p): $\hat{\lambda}_{m(p)} = \hat{\lambda}$.

If the initial pulse sequence is made up of a plurality of pulse trains that follow one another over time, each moment m(p) being associated with a distinct pulse train, during step 70, one first performs the precise estimate of the pattern repetition period $\hat{\lambda}_{m(p)}$ associated with the moment m(p), as well as the associated variance $\text{var}(\hat{\lambda}_{m(p)})$.

The calculations done are similar to that of step 24, over all of the pulses extracted in step 60.

Next, for any type of pulse sequence, the following calculations are applied to estimate the phase $\hat{\mu}_{m(p),t_0}$ associated with the moment m(p), using the reference date of arrival $t_0$.

The calculation is done on the pulses selected in step 60, which are a number of N(p) pulses.

The following vectorial sum is calculated, making it possible to obtain a resultant vector S(p):

$$S(p) = \sum_{k=1}^{N(p)} \exp\left(i\phi(t_{k,p})_{\hat{\lambda}_{m(p)},t_0}\right) \quad \text{(EQ 10)}$$

Where $t_{k,p}$ is the date of arrival of the $k^{th}$ pulse at moment m(p), and the values $$\phi(t_{k,p})_{\hat{\lambda}_{m(p)},t_0}$$

are calculated according to equation (EQ 1) with the estimated pattern repetition period value $\hat{\lambda}_{m(p)}$.

The estimate of the phase $\hat{\mu}_{m(p),t_0}$ associated with the moment m(p) is given by:

$$\hat{\mu}_{m(p),t_0} = \arg[S(p)] \quad \text{(EQ 11)}$$

Where arg[S(p)] is the argument of the vector S(p).

The variance associated with this estimate is given by:

$$\text{var}(\hat{\mu}_{m(p),t_0}) = -2\ln\left(\frac{1}{N(p)}|S(p)|\right) \quad \text{(EQ 12)}$$

Where |S(p)| is the norm of the vectorial sum S(p) and ln(x) is the neperian logarithm of x.

Returning to FIG. 2, step 70 for precisely estimating the phase of the moment m(p) is followed by a step 80 for characterizing the initial pulse sequence by recording a summary comprising characteristic parameters of said sequence:

In the case where the processed pulse sequence is made up of interleaved pulse trains, the summary includes:
The number of moments P;
The calculated values of the pattern repetition period $\hat{\lambda}$, and the associated variance;
For each moment, the estimated phase value $\hat{\mu}_{m(p),t_0}$, and the associated variance.

In the case where the processed pulse sequence is made up of successive pulse trains, the summary includes:
The number of moments P,
For each moment:
the calculated values of the pattern repetition period $\hat{\lambda}_{m(p)}$, the associated variance,
the estimated phase value $\hat{\mu}_{m(p),t_0}$, and the associated variance.

These summaries making it possible to characterize the processed pulse sequence are stored, and can be used in an exploitation step 90 for various applications, for example the comparison with prerecorded signal characteristics making it possible to identify the emission mode of the intercepted signal.

Of course, the summaries can be used for any processing application on the radar pulses.

The inventive method is implemented by a programmable device, which may be either integrated into a radar reception device, or independent and used for later processing.

Figure 4:
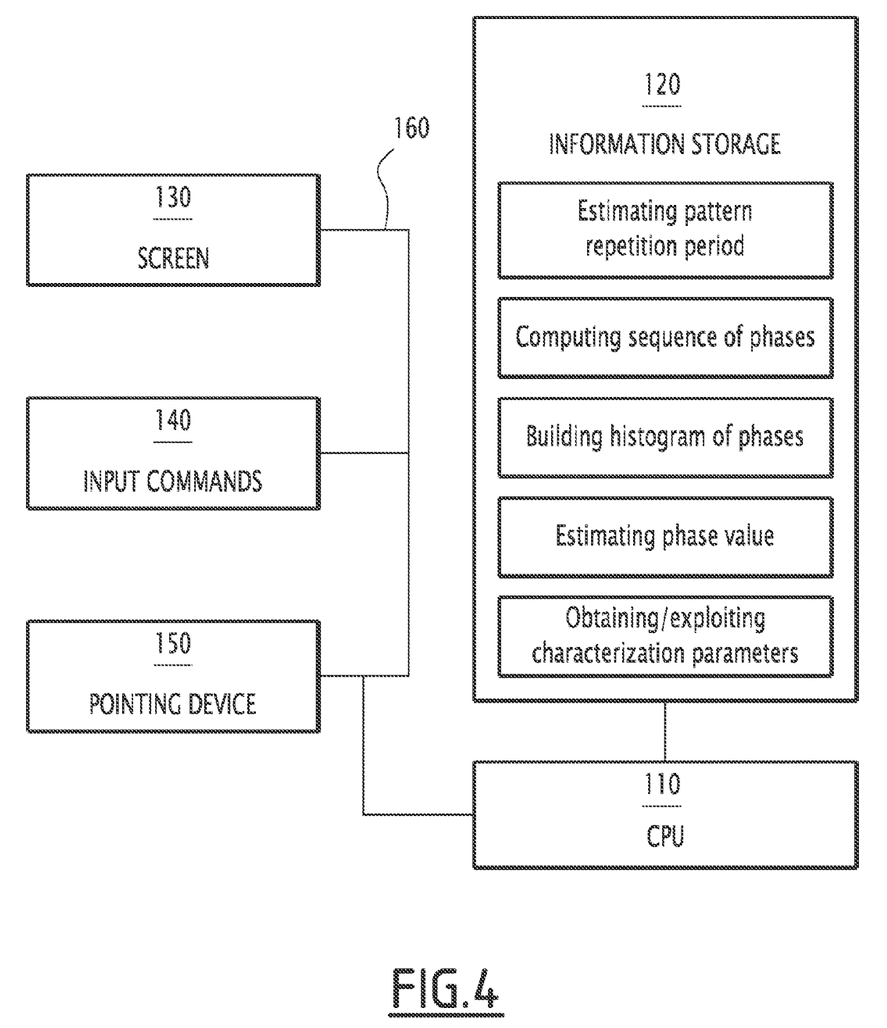
FIG. 4 is a diagram showing the functional blocks of a programmable device able to carry out the invention.

A programmable device 100, as illustrated schematically in FIG. 4, able to implement the invention, typically a computer, comprises a central processing unit 110, or CPU, able to execute computer program instructions when the device 100 is powered on. The device 100 also includes information storage means 120, for example registers or memories, able to store executable code instructions making it possible to run a program including code instructions able to carry out the method according to the invention.

In one embodiment, the software instructions for executing the method for processing a signal formed by a sequence of pulses as briefly described above are stored on an information recording medium, for example an external memory, a mass storage memory, an external disc. When the information recording medium is connected to the programmable device, said device is able to execute said software instructions, as explained above.

Optionally, the programmable device 100 comprises a screen 130 and means 140 for entering commands from an operator, for example a keyboard, optionally an additional pointing means 150, such as a mouse, able to select graphic elements displayed on the screen 130.

The various functional blocks 110 to 150 of the device 100 described above are connected via a communication bus 160.

In an alternative that is not shown, the programmable device 100 is made in the form of programmable logic components, such as one or more FPGA (Field-Programmable Gate Array), or in the form of dedicated integrated circuits of the ASIC (Application-Specific Integrated Circuit) type.

Advantageously, the proposed method makes it possible to process any type of pulse sequence, whether involving interleaved or successive pulse trains.

The invention makes it possible to process signals having several pattern repetition periods, and several phases for each pattern repetition period.

Advantageously, the proposed method makes it possible to obtain reliable summaries, even in case of random pulse losses, and in addition, the reliability level of each estimate is quantifiable owing to the associated estimating variance, which is also calculated and stored.

The invention claimed is:

1. A method for processing a radar signal formed of a sequence of pulses, comprising a repeating pattern of pulses, the pattern being repeated in the radar signal with a pattern repetition period, the method comprising:
   estimating the pattern repetition period of the radar signal;
   calculating a sequence of phases as a function of a timeslot of arrival of each pulse relative to a chosen reference timeslot, and of the estimated pattern repetition period;
   from the calculated sequence of phases, estimating at least one phase value and an associated standard deviation, the phase value being associated with a phase moment representative of the repeating pattern;
   obtaining characterization parameters of the radar signal by using the estimated phase values; and
   identifying an emission mode of the radar signal from the characterization parameters.

2. The method according to claim 1, further comprising, after said calculating a sequence of phases:
   building a histogram of phases; and
   extracting one or more peaks from the histogram, each peak being associated with a phase moment of the sequence of pulses.

3. The method according to claim 2, further comprising estimating a phase associated with a moment of the sequence of pulses, the moment being associated with a peak of the phase histogram, comprising:
   extracting a subset of timeslots of arrival around the peak; and
   obtaining a precise estimate of the phase value associated with the moment, and a variance associated with the estimated phase value.

4. The method according to claim 3, wherein, when the sequence of pulses comprises a plurality of interleaved pulse trains, each pulse train having an associated phase moment, said obtaining comprises summing unit vectors to derive a resultant vector, each unit vector having an orientation equal to a calculated phase value, with the pattern repetition period of the signal estimated beforehand, from a timeslot of arrival of the subset.

5. The method according to claim 4, wherein the phase value associated with the estimated moment is equal to the argument of the resultant vector.

6. The method according to claim 3, wherein, when the sequence of pulses comprises a plurality of successive pulse trains, each pulse train having an associated phase moment, said obtaining comprises estimating a pattern repetition period corresponding to the moment from a subset of considered timeslots of arrival.

7. The method according to claim 1, wherein said estimating the pattern repetition period of the signal comprises:
   estimating a first rough estimate of a first estimated value of the pattern repetition period; and
   estimating a second refined estimate of a second estimated value of the pattern repetition period.

8. The method according to claim 1, wherein during said calculating a sequence of phases, the method further comprises, for each pulse timeslot of arrival $t_n$, applying a period folding equal to the estimated pattern repetition period according to the following formula:

$$\phi(t_n)_{\lambda, t_0} = \lambda \cdot \left( \frac{t_n - t_0}{\lambda} - \left\lfloor \frac{t_n - t_0}{\lambda} \right\rfloor \right)$$

where $\lfloor x \rfloor$ is the result of rounding down the real number x to the nearest integer, $t_0$ is the reference timeslot, and $\lambda$ is the estimated pattern repetition period.

9. A non-transitory computer readable medium storing instructions, which, when executed by a processor of an electronic device, cause the processor to process a radar signal formed by a sequence of pulses, according to the method of claim 1.

10. A device for processing a radar signal formed of a sequence of pulses, comprising a repeating pattern formed of at least one pulse, the pattern being repeated in the signal with a pattern repetition period, the device comprising:
    circuitry for estimating the pattern repetition period of the signal;
    circuitry for computing a sequence of phases, as a function of a timeslot of arrival of each pulse relative to a chosen reference arrival date and the estimated pattern repetition period;
    circuitry for estimating, from the calculated sequence of phases, at least one phase value and an associated standard deviation, the phase value being associated with a phase moment representative of the repeating pattern; and
    circuitry for obtaining characterization parameters of the digital signal by using the estimated phase values, and for identifying an emission mode of the radar signal from the characterization parameters.

11. The device according to claim 10, further comprising circuitry for building a histogram of phases, and extracting one or more peaks from the histogram, each peak being associated with a phase moment of the sequence of pulses.

* * * * *